(12) United States Patent
Saito et al.

(10) Patent No.: US 8,739,075 B2
(45) Date of Patent: May 27, 2014

(54) METHOD OF MAKING PATTERN DATA, AND MEDIUM FOR STORING THE PROGRAM FOR MAKING THE PATTERN DATA

(75) Inventors: Muneto Saito, Kawasaki (JP); Koichi Suzuki, Kawasaki (JP); Mitsuo Sakurai, Kawasaki (JP); Norimasa Nagase, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 768 days.

(21) Appl. No.: 12/405,265

(22) Filed: Mar. 17, 2009

(65) Prior Publication Data

US 2009/0241086 A1 Sep. 24, 2009

(30) Foreign Application Priority Data

Mar. 21, 2008 (JP) ................................. 2008-072869

(51) Int. Cl.
*G06F 17/50* (2006.01)
(52) U.S. Cl.
USPC ................... 716/50; 716/51; 716/52; 716/53; 716/54; 716/55; 716/56
(58) Field of Classification Search
USPC ..................................................... 716/50–55
See application file for complete search history.

(56) References Cited

U.S. PATENT DOCUMENTS

| | | | |
|---|---|---|---|
| 5,625,564 A * | 4/1997 | Rogoyski | 716/51 |
| 5,764,097 A | 6/1998 | Whitfield | |
| 5,793,644 A * | 8/1998 | Koford et al. | 716/123 |
| 6,047,116 A * | 4/2000 | Murakami et al. | 716/54 |
| 6,237,133 B1 * | 5/2001 | Suzuki | 716/55 |
| 6,505,327 B2 * | 1/2003 | Lin | 716/52 |
| 6,637,010 B2 * | 10/2003 | Yamamoto | 716/53 |
| 6,873,186 B2 | 3/2005 | Gion | |
| 6,901,574 B2 * | 5/2005 | LaCour et al. | 716/55 |
| 7,172,838 B2 * | 2/2007 | Maurer et al. | 430/5 |
| 7,337,421 B2 * | 2/2008 | Kamat | 716/53 |
| 7,401,319 B2 * | 7/2008 | Horng et al. | 716/53 |
| 7,827,518 B2 * | 11/2010 | Wu et al. | 716/53 |
| 8,141,006 B2 * | 3/2012 | Okada | 716/53 |

FOREIGN PATENT DOCUMENTS

| | | |
|---|---|---|
| JP | 05-343980 A | 12/1993 |
| JP | 2816124 B | 8/1998 |
| JP | 3343246 B | 8/2002 |
| JP | 2005-33718 A | 2/2005 |
| JP | 2005-84101 A | 3/2005 |
| JP | 2007-86587 A | 4/2007 |
| WO | WO-00/67074 | 11/2000 |

\* cited by examiner

*Primary Examiner* — Helen Rossoshek
(74) *Attorney, Agent, or Firm* — Fujitsu Patent Center (57) ABSTRACT

A method of making pattern data of a photomask pattern includes: the processes of adding, to each of first cells, information of the first cell higher than the first cell on the basis of a hierarchical structure; selecting, from the first cells included in one level of the hierarchical structure, the first cell identical to one of the first cells included in a level higher than the one level and the first cell placed inside two or more of the first cells included in a level immediately higher than the one level, and forming a cell group with the selected first cells; making pattern data of the first cells not included in the cell group in consideration of the optical proximity effect and forming a fourth cell group with second cells including the pattern data; and replacing the first cells with the corresponding second cells in input data.

9 Claims, 11 Drawing Sheets

METHOD OF MAKING PATTERN DATA, AND MEDIUM FOR STORING THE PROGRAM FOR MAKING THE PATTERN DATA

CROSS REFERENCE TO RELATED APPLICATION

This application is based upon and claims the benefit of priority from the prior Japanese Patent Application NO. 2008-72869 filed on Mar. 21, 2008, the entire contents of which are incorporated herein by reference.

BACKGROUND OF THE INVENTION

1. Field of the Invention

The embodiments discussed herein are relates to a method of making pattern data of a photomask used to manufacture a Large Scale Integration (LSI) circuit device, a program for making the pattern data, and a medium for storing the program.

2. Description of the Related Art

In the manufacture of an LSI circuit device, an element pattern forming a circuit has been desired to be miniaturized for higher integration. Further, in the formation of a minute pattern, to obtain a predetermined element characteristic, the element pattern needs to be formed on a semiconductor substrate as designed and with high accuracy. However, if a photomask pattern used to manufacture the LSI circuit device has not been formed in consideration of the optical proximity effect, the element pattern as designed cannot be formed on the semiconductor substrate in the transfer of the pattern onto the semiconductor substrate.

Therefore, to form a photomask pattern in consideration of the optical proximity effect, correction in consideration not only of rotation information, axis inversion information, and magnification information but also of Optical Proximity Correction (OPC) as it is called (OPC processing) has been performed on design data for forming the element pattern to make data used to form the photomask pattern.

The above-described OPC processing is performed on the design data for forming all element patterns on the basis of the space and the width of the element patterns and optical conditions. Therefore, if the number of pattern data items for forming the element patterns is large, the OPC processing requires a long period of time.

In view of the above, a proposal has been made to first determine the OPC processing for a first area, and then reuse the OPC processing for the first area in a second area having a pattern identical to the pattern included in the first area, to thereby reduce the time period required for the OPC processing (e.g., Japanese Patent No. 3343246).

Further, another proposal has been made to first register second cells obtained by the OPC processing previously performed on first cells which are formed by a plurality of element patterns and repeatedly used, and then replace the first cells with the second cells to perform the OPC processing on the entire design data, to thereby reduce the time period required for the OPC processing (e.g., Japanese Laid-open Patent Publication Nos. 2007-86587 and 2005-84101).

It is obvious from the above description that the time period required for the OPC processing can be further reduced, if it is possible to effectively identify particular areas or cells to be subjected to the OPC processing, and to effectively identify, among the areas or cells, a larger number of areas or cells considered to be equivalent in the purpose of the OPC processing.

SUMMARY OF THE INVENTION

According to one aspect of the embodiments discussed herein, a method of making pattern data of a photomask used in LSI manufacture from input data including first cells which include pattern data used in pattern formation and which form a hierarchy. The method of making pattern data of a photomask includes: a first cell group formation process of sequentially focusing on all levels of the hierarchy, selecting, from the first cells included in the focused one of the levels, the first cell identical to one of the first cells included in a level higher than the focused level and the first cell placed inside two or more of the first cells included in a level immediately higher than the focused level, and adding the selected first cells to a first cell group; a second cell group formation process of sequentially adding, on all levels of the hierarchy, the first cells not selected in the first cell group formation process to a second cell group; a third cell group formation process of excluding, from the first cells included in the second cell group, the first cell identical to the first cells included in the first cell group to form a third cell group; and a fourth cell group formation process of converting pattern data forming the first cells included in the third cell group to make converted pattern data in which the optical proximity effect has been corrected, and forming a fourth cell group with second cells including the converted pattern data.

The object and advents of the embodiments will be realized and attained by means of the elements and combinations particularly pointed out in the claims.

It is to be understood that both the foregoing general description and the following detailed description and are exemplary and explanatory and are not restrictive of the embodiments, as claimed.

DESCRIPTION OF THE PREFERRED EMBODIMENTS

First and second embodiments of the present invention will be described below. The present invention, however, is not limited to the embodiments.

First Embodiment

Figure 1:
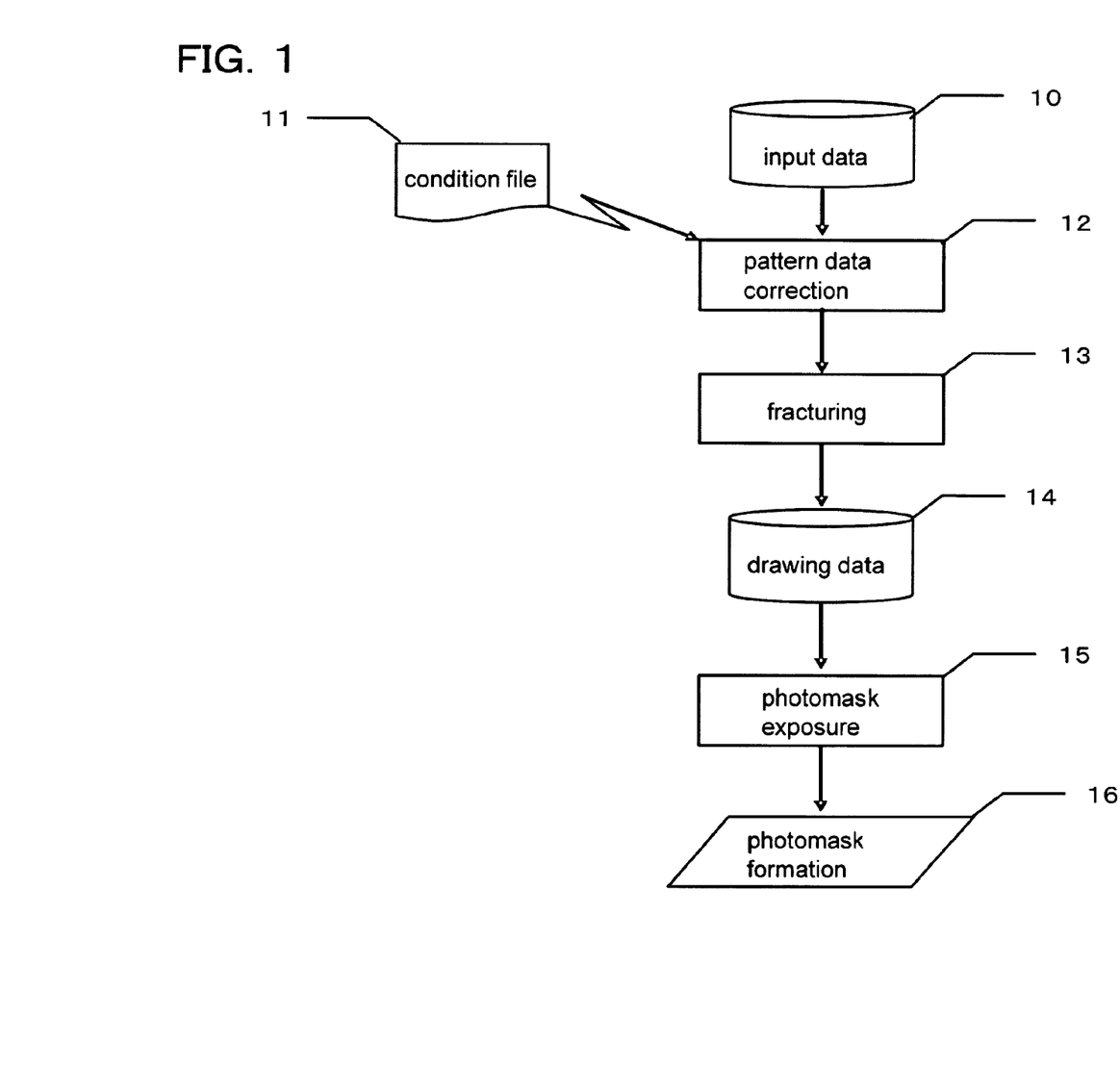
FIG. 1 illustrates a flowchart of a general photomask manufacturing process.

FIG. 1 illustrates a flowchart of a general photomask manufacturing process. According to the flowchart of FIG. 1, the manufacture of a photomask is performed through a process of pattern data correction 12 and a process of fracturing 13 to make drawing data 14 and then through a process of photomask exposure 15 and a process of photomask formation 16.

The process of the pattern data correction 12 is a process of making pattern data by capturing a condition file 11 and performing OPC processing on input data 10 to suppress pattern deformation caused by the optical proximity effect. Herein, the input data 10 is pattern data not yet subjected to the OPC processing and representing an actual pattern forming a semiconductor device. Further, the condition file 11 is a file described with the shape, the placement, and the amount of pattern correction of the actual pattern. The process of the pattern data correction 12 will be further described in detail with reference to FIG. 2.

The process of the fracturing 13 is a process of converting the pattern data subjected to the OPC processing into the drawing data 14. Herein, the drawing data 14 is data used when an exposure device applies an electron beam to a resist layer formed on a metal layer (e.g., a chrome layer) accumulated on quartz glass to draw a resist pattern.

The process of the photomask exposure 15 is a process in which the exposure device applies the electron beam to the resist layer to draw the resist pattern by using the drawing data 14.

Herein, the photomask includes the quartz glass and a metal pattern formed on the quartz glass. Upon application of light to the photomask, the metal pattern is transferred to the resist layer formed on a semiconductor substrate to form a pattern forming an element included in the semiconductor device. The photomask is referred to as a so-called mask or reticle, depending on the method of using the photomask and the configuration of the repetition unit of the metal pattern.

The process of the photomask formation 16 is a process of performing the following operations. Firstly, after the formation of the resist pattern on the metal layer (e.g., the chrome layer) accumulated on the quartz glass, the metal layer is etched with the resist pattern used as a mask. Then, ashing of the resist pattern and washing of the quartz glass are performed to remove the resist pattern. As a result, the metal pattern is formed on the quartz glass.

Figure 2:
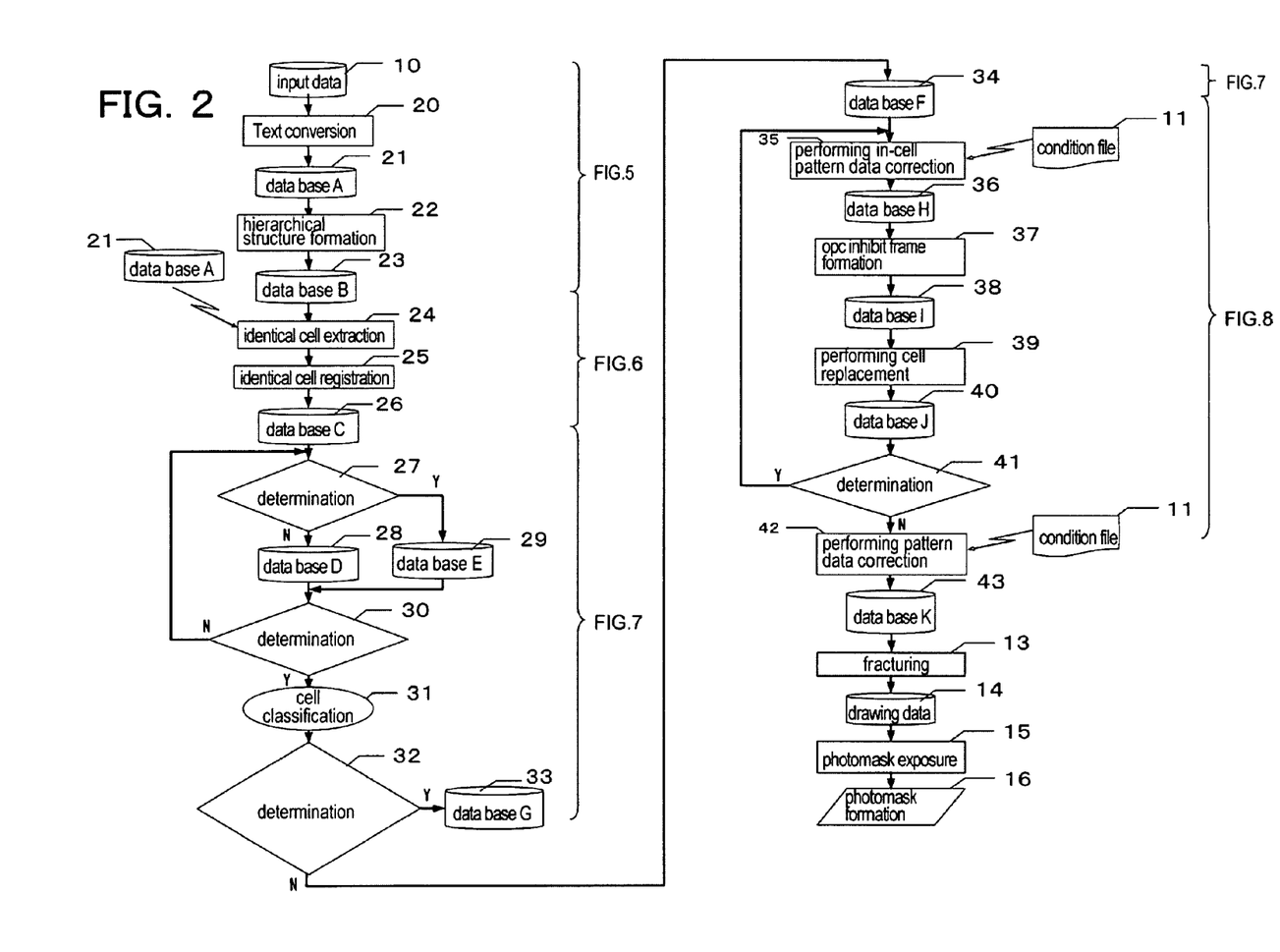
FIG. 2 illustrates a flowchart of a process of pattern data correction.

FIG. 2 illustrates a flowchart of the process of the pattern data correction 12. A pattern data creation method of the first embodiment is formed by the process of the pattern data correction 12.

According to the pattern data creation method of the first embodiment, the following databases are formed. Firstly, a database A21 is formed by data A obtained by a process of text conversion 20 performed on the input data 10. Then, a database B23 is formed by data B obtained by a process of hierarchical structure formation 22 performed with the use of the data A. The data creation performed in the process of the text conversion 20 and the process of the hierarchical structure formation 22 will be described in detail with reference to FIG. 5. Herein, if a cell is assumed to be formed by the combination of a plurality of pattern data items, and if placement information data of the cell is included in another cell, the another cell is referred to as a higher level cell of the cell. Further, if the entire pattern data is formed not solely by the cell but by the cell and the higher level cell thereof, the structure of the entire pattern data is referred to as a hierarchical structure.

Then, a database C26 is formed by data C obtained by a process of identical cell extraction 24 and a process of identical cell registration 25 performed with the use of the databases B23 and A21. The creation of the data C will be described in detail with reference to FIG. 6.

Then, with the use of the database C26, determination 27 is made on whether or not a cell included in a target level is identical to one of cells included in a level higher than the target level and whether or not two or more higher level cells included in a level immediately higher than the target level include the placement information data of a cell included in the target level. If the cell is determined to be negative in the determination 27, the cell is registered in a database D28 to form the database D28. Meanwhile, if the cell is determined to be positive in the determination 27, the cell is registered in a database E29 to form the database E29.

Then, determination 30 is made on whether or not the determination 27 has been made on the cells included in all levels. If the result of the determination 30 is negative, the determination 27 is further made. Meanwhile, the result of the determination 30 is positive, cell classification 31 is completed.

Then, determination 32 is made on whether or not the database D28 includes a cell identical to the cells included in the database E29. The cell of the database D28 determined to be positive in the determination 32 and the cells of the database E29 are registered in a database G33. Meanwhile, the cell of the database D28 determined to be negative in the determination 32 is registered in a database F34. As a result, the databases F34 and G33 are formed. The registration of the cells in the databases D28, E29, F34, and G33 will be described in detail with reference to FIG. 7.

Then, the condition file 11 is input to perform in-cell pattern data correction 35. That is, the so-called OPC processing is performed. As a result, a cell subjected to the OPC processing forms a database H36.

The cell subjected to the OPC processing is then subjected to OPC inhibit frame formation 37. Herein, it is assumed that pattern data always subjected to the same correction without being affected by a cell placed adjacent to the cell subjected to the OPC processing has been extracted from the pattern data forming the cell subjected to the OPC processing. Further, what is represented by the pattern data forming a cell is referred to as an actual pattern. Further, the combination of actual patterns is referred to as an actual cell layout. Herein, in the actual cell layout, the outer circumference of an area occupied by actual patterns corresponding to the pattern data always subjected to the same correction is referred to as an OPC inhibit frame.

Then, a cell formed by the pattern data always subjected to the same correction is defined. That is, a cell formed by the pattern data representing the pattern inside the OPC inhibit frame is defined. Then, the cell formed by the pattern data representing the pattern inside the OPC inhibit frame is registered in a database I38 to form the database I38.

Then, the cell subjected to the OPC processing is formed by the cell formed by the pattern data representing the pattern inside the OPC inhibit frame and the pattern data outside the OPC inhibit frame. Then, the area inside the OPC inhibit frame of the cell not yet subjected to the OPC processing is replaced by the cell formed by the pattern data representing the pattern inside the OPC inhibit frame subjected to the OPC processing, to thereby form a replacement cell. That is, cell replacement 39 is performed, and the replacement cell is registered in a database J40 to form the database J40. Then, determination 41 is made on whether or not the above-described process has been performed on the cells excluding the highest cell. As a result, if it is determined that the cell replacement 39 has been performed on the cells excluding the highest cell, the procedure proceeds to the next process.

In a process of pattern data correction 42, the following processes are performed. Firstly, the pattern data outside the OPC inhibit frame forming the database J40 is associated with the highest cell.

Then, upon the input of the condition file 11, the pattern data included in the highest cell and located outside the OPC inhibit frame (the pattern data not yet subjected to the OPC processing) is subjected to the pattern data correction 42, i.e., the so-called OPC processing. As a result, a database K43 is formed.

Then, the fracturing 13 described with reference to FIG. 1 is performed on the pattern data included in the database K43 to form the drawing data 14.

Figure 3:
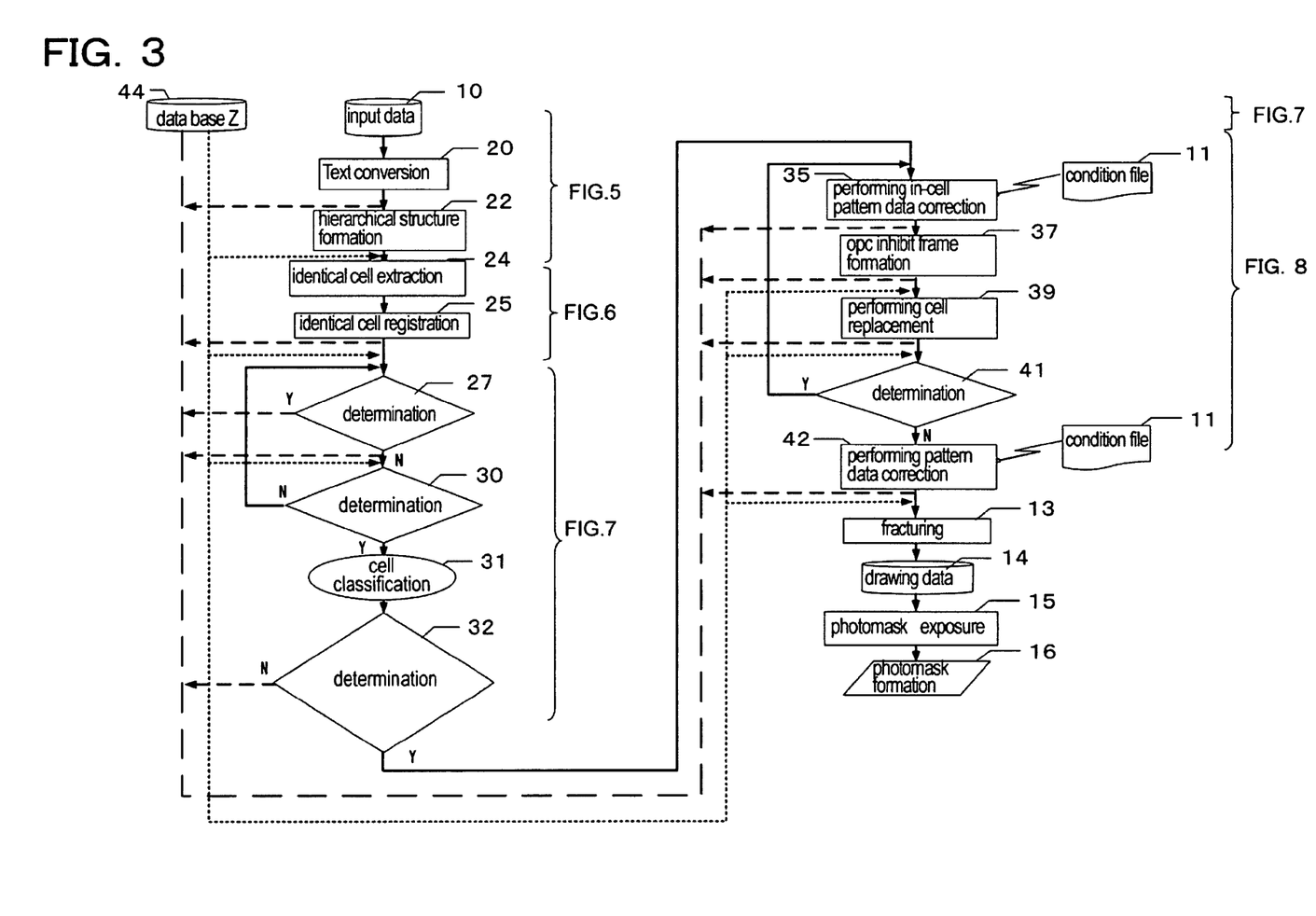
FIG. 3 illustrates a flowchart of a modified process of the process of the pattern data correction illustrated in FIG. 2.

FIG. 3 illustrates a flowchart of a modified process of the process of the pattern data correction 12 illustrated in FIG. 1 (the process illustrated in detail in FIG. 2). In the process of the pattern data correction 12 illustrated in FIG. 1 (the process illustrated in detail in FIG. 2), a plurality of databases for registering the pattern data are employed in the process of making the drawing data 14 from the input data 10. In this case, however, the process of making a database is required every time the pattern data is processed. In view of this, the modified example of the process of the pattern data correction 12 illustrated in FIG. 3 forms a database integrating the above-described databases, and manages the pattern data by dividing pattern data items of different formats for the respective sections.

The processes forming the flowchart illustrated in FIG. 3 include the processes of the fracturing 13, the creation of the drawing data 14, the text conversion 20, the hierarchical structure formation 22, the identical cell extraction 24, the identical cell registration 25, the determination 27, the determination 30, the cell classification 31, the determination 32, the in-cell pattern data correction 35, the OPC inhibit frame formation 37, the cell replacement 39, the determination 41, and the pattern data correction 42. To perform the processes illustrated in FIG. 3, the input data 10 and the condition file 11 are required. Further, the pattern data processed by the processes illustrated in FIG. 3 is registered in a database Z44.

The processes, the input data 10, and the condition file 11 the same as the processes, the input data 10, and the condition file 11 illustrated in FIG. 2 are assigned with the same numerals. Thus, description of the processes, the input data 10, and the condition file 11 illustrated in FIG. 3 the same as the ones illustrated in FIG. 2 will be omitted.

The database Z44 is a database capable of registering the pattern data or the cells of the databases A21, C26, D28, E29, G33, H36, I38, J40, and K43 illustrated in FIG. 2. Herein, the databases B23 and F34 are not described, since the data to be registered in the databases B23 and F34 is directly used.

After the process of the text conversion 20, the data obtained by the process of the text conversion 20 performed on the input data 10 is written in the database Z44. Further, with the use of the data obtained by the process of the hierarchical structure formation 22 and the data to be registered in the database A21, the process of the identical cell extraction 24 is performed. Further, after the identical cell registration 25, the data to be registered in the database C26 is written in the database Z44. Then, the data to be registered in the database C26 is read from the database Z44, and the determination 27 is made. In the determination 27, the data of the cell having the identical cell is registered in the database Z44 as the data to be registered in the database E29. Meanwhile, the data of the cell not having the identical cell is registered in the database Z44 as the data to be registered in the database D28. Thereafter, in the determination 32, the data to be registered in the database D28 is read from the database Z44, and the process of the determination 32 is performed.

As a result, the data to be registered in the database G33 is registered in the database Z44. The data to be registered in the database F34 is directly used. Thereafter, the data items to be registered in the databases H36, I38, and J40 are sequentially registered in and read from the database Z44 after the sequential execution of the in-cell pattern data correction 35, the OPC inhibit frame formation 37, and the cell replacement 39, respectively. Further, after the pattern data correction 42, the data to be registered in the database K43 is registered in the database Z44.

Figure 4:
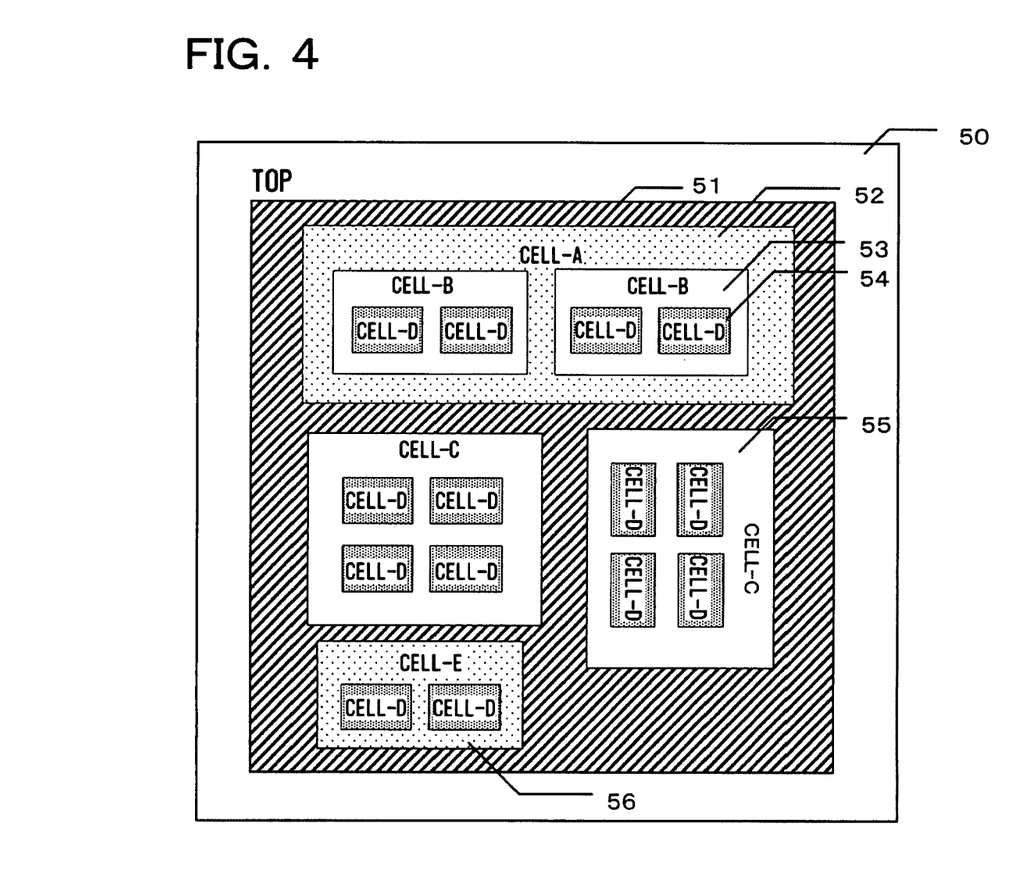
FIG. 4 illustrates a cell and cell placement image represented by input data.

With reference to FIG. 4, description will be made of a cell and cell placement image 50 represented by the input data 10. The cell and cell placement image 50 shows a top cell 51, a cell A52, cells B53, cells D54, cells C55, and a cell E56. In the top cell 51, the cell A52, the two cells C55, and the cell E56 are placed. That is, the top cell 51 has the placement information of the cell A52, the cells C55, and the cell E56, and serves as a higher level cell of these cells. In the cell A52, the two cells B53 are placed. That is, the cell A52 has the placement information of the two cells B53, and serves as a higher level cell of the cells B53.

In each of the cells C55, the cells D54 are placed. That is, the cell C55 has the placement information of the four cells D54, and serves as a higher level cell of the cells D54.

In the cell E56, the cells D54 are placed. That is, the cell E56 has the placement information of the two cells D54, and serves as a higher level cell of the cells D54.

Figure 5:
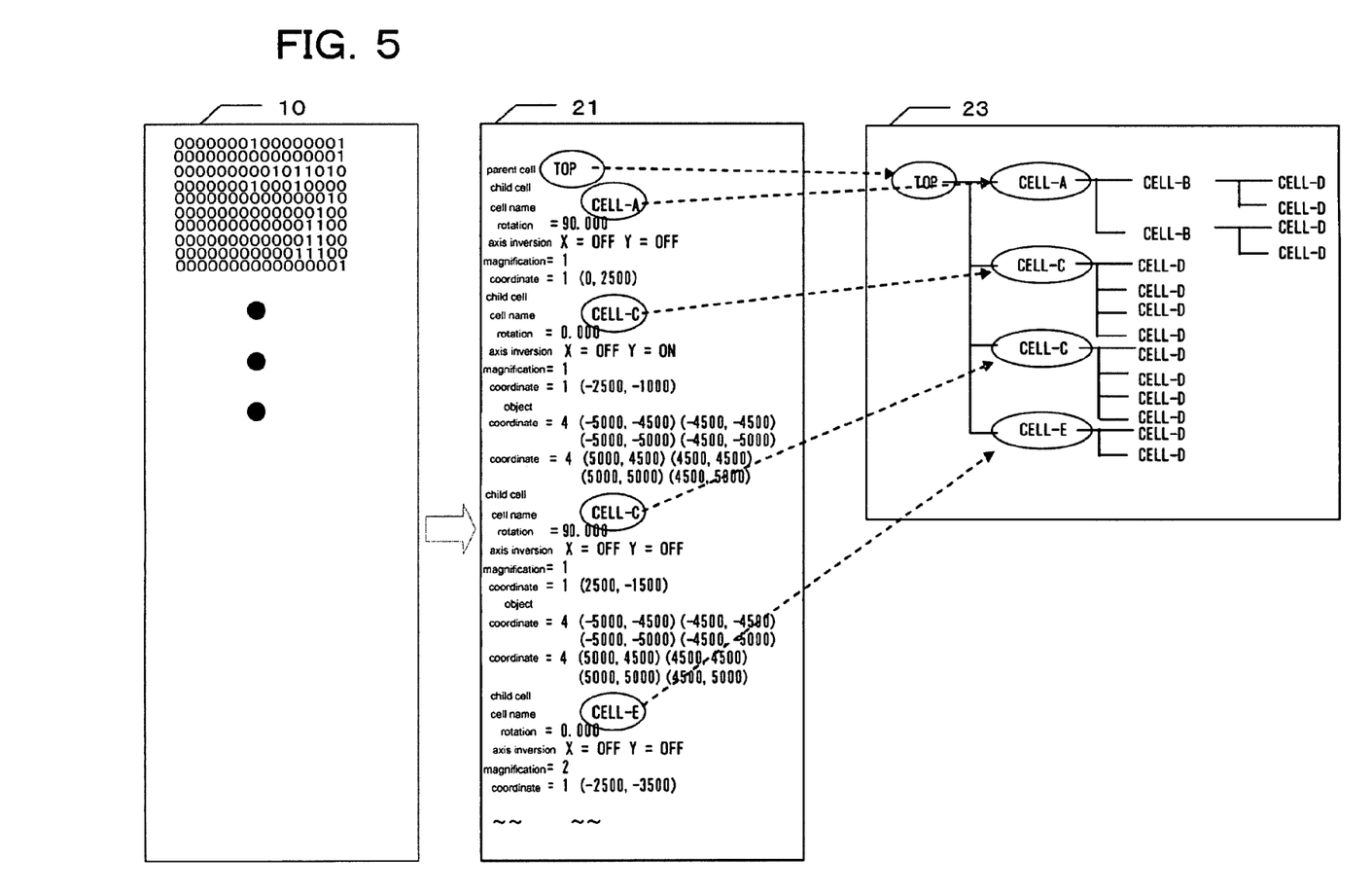
FIG. 5 illustrates a process of text conversion of the input data and a process of hierarchical structure formation.

With reference to FIG. 5, description will be made of the process of the text conversion 20 of the input data 10 and the process of the hierarchical structure formation 22. The input data 10 is formed by binary data. Thus, it takes time to retrieve the information of the hierarchical structure formation 22 by using the input data 10. This is because the above-described information is formed by a plurality of binary data items, and thus it is after the identification of the relationship between the binary data items that the information is retrieved.

In view of the above, the text conversion 20 is performed to make text data from the input data 10. Herein, the process of the text conversion 20 converts a plurality of mutually related binary data items into the text data representing text and having hexadecimal digits. The respective text data items are related to text. If the process of the text conversion 20 is performed, therefore, the information retrieval using the text data can be performed in a short time. Then, the text data is registered in the database A21. The text data representing a child cell includes a cell name, placement coordinates in a parent cell, rotation information, X-Y axis inversion information, magnification information, and vertex coordinates of an object included in the child cell. For example, according to the text data illustrated in FIG. 5, the top cell 51 is the parent cell, and the cell A52, the two cells C55, and the cell E56 are the child cells. As for the upper cell C55 of the two cells C55, the cell name is CELL-C, the rotation information is 0.00, the X-Y axis inversion information is axis inversion with X=OFF and Y=ON, the magnification information is magnification=0, the placement coordinates are one set of coordinates (−2500, −1000), and the vertex coordinates of an object included in the upper cell C55 are four sets of coordinates (−5000, −4500), (−4500, −4500), (−5000, −5000), and (−4500, −5000), and four sets of coordinates (5000, 4500), (4500, 4500), (5000, 5000), and (4500, 5000). The text data of the other cells C55, A52, and E56 also includes similar information. However, the cells A52 and E56 do not include an object. Thus, the text data of these cells do not include the vertex coordinates of an object.

Subsequently, the process of the hierarchical structure formation 22 is a process of recognizing the parent cell and the child cells placed inside the parent cell through the information retrieval using the text data, and making data representing the hierarchical structure formed by the parent cell and the child cells. Thereafter, the data representing the hierarchical structure formed by the parent cell and the child cells is registered in the database B23 for each of the child cells included in the target level. Herein, the data representing the hierarchical structure formed by the parent cell and the child cells includes the cell name of the child cell, the cell names of all higher level cells relating to the child cell, the placement coordinates of the child cell inside the higher level cell (the parent cell) of a level immediately higher than the level of the child cell, the rotation information, the X-Y axis inversion information, the magnification information, and the vertex coordinates of an object included in the child cell. The placement coordinates, the rotation information, the X-Y axis inversion information, the magnification information, and the vertex coordinates of an object included in the child cell are similar to the corresponding ones included in the text data representing the child cell. The database B23 illustrated in FIG. 5 describes a tree diagram representing the hierarchical structure in accordance with the information represented by "the cell names of all higher level cells relating to the child cell." The tree diagram, however, is different from the data representing the actual hierarchical structure formed by the parent cell and the child cells. Further, according to the tree diagram, the cell A52, the cell E56, and the two cells C55 are included in a level lower than the level of the top cell 51. Further, the two cells B53 are included in a level lower than the level of the cell A52. The two cells D54 are included in a level lower than the level of each of the cells B53. The four cells D54 are included in a level lower than the level of each of the cells C55. The two cells D54 are included in a level lower than the level of the cell E56.

Figure 6:
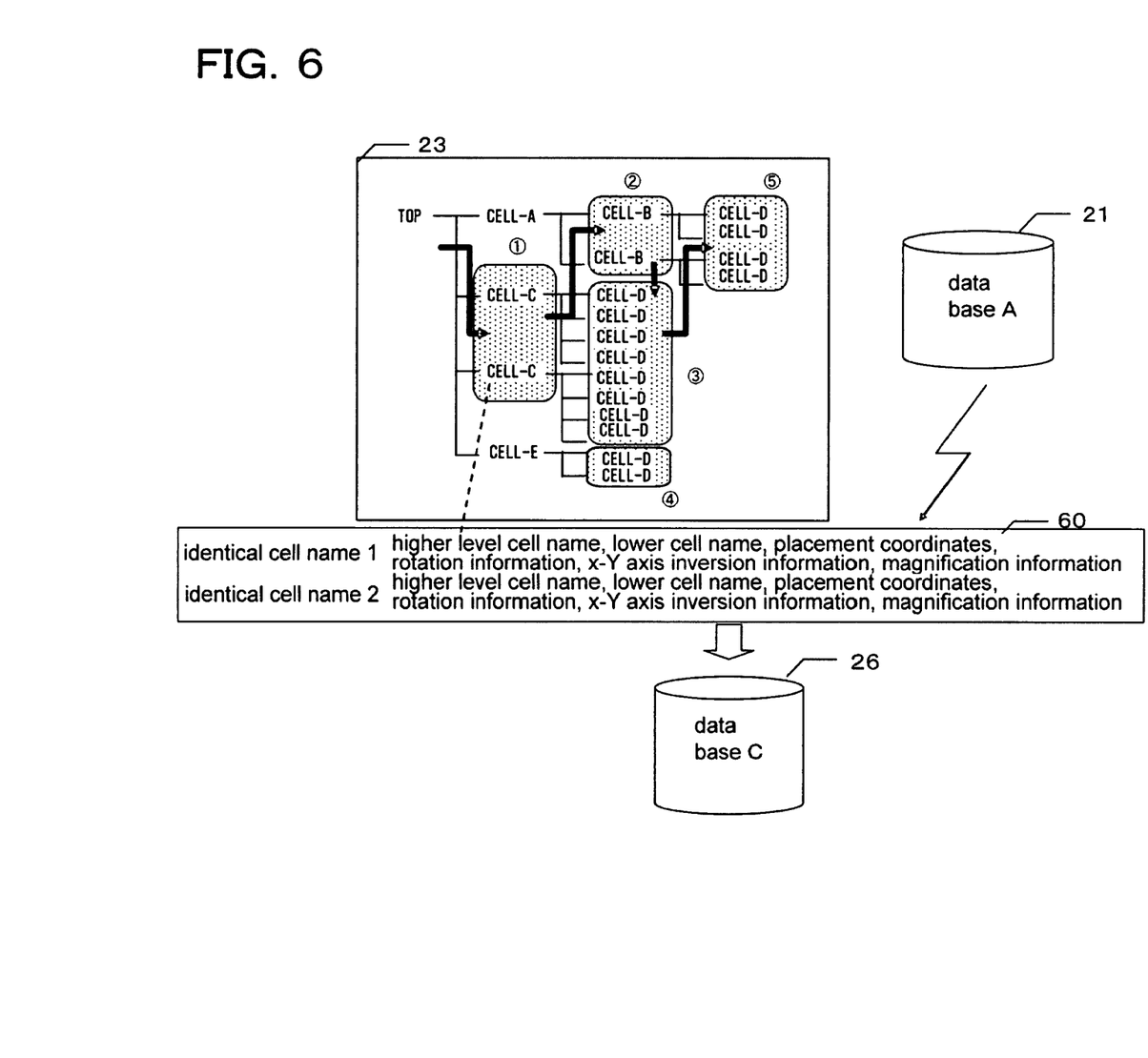
FIG. 6 illustrates a process of identical cell extraction and a process of identical cell registration.

With reference to FIG. 6, description will be made of the process of the identical cell extraction 24 and the process of the identical cell registration 25.

The process of the identical cell extraction 24 includes a process of identifying, with the use of the text data registered in the database A21, two or more cells having the same cell name as the identical cells in the same target level, and a process of selecting a cell of the target level placed inside two or more cells of a level immediately higher than the target level. Then, with the use of the placement coordinates, the rotation information, the X-Y axis inversion information, and the magnification information of the cells, and the vertex coordinates of an object included in the identical cells, whether or not the cells are identical is determined. If the cells are different in the rotation information and the X-Y axis inversion information but are identical in the other information, the cells are determined to be the identical cells.

Subsequently, the identical cell registration 25 is a process of making registration data 60 of the identical cells, and registering the registration data 60 in the database B23 to form the database C26. Herein, the registration data 60 includes the cell name of the identical cells, the cell name of a higher level cell in which the identical cells are placed, the cell name of a lower cell included in the identical cells, the placement coordinates of the identical cells in the higher level cell (the parent cell) of a level immediately higher than the level of the identical cells, the rotation information of the identical cells, the X-Y axis inversion information of the identical cells, and the magnification information of the identical cells. The placement coordinates, the rotation information, the X-Y axis inversion information, the magnification information, and the vertex coordinates of an object included in the identical cells are similar to the corresponding ones included in the text data representing the identical cells. Accordingly, the database C26 includes the registration data 60 and the data representing the hierarchical structure formed by the parent cell and the child cells. In the database B23 illustrated in FIG. 6, a tree diagram representing the hierarchical structure is described in accordance with the data representing the actual hierarchical structure formed by the parent cell and the child cells, particularly the information represented by "the cell names of all higher level cells relating to the child cell." Further, each of the hatched areas including two cells C, two cells B, ten cells D, and four cells D, respectively, conceptually represents the area in which the cells included in the hatched area have been recognized as the identical cells on the basis of the identical cell extraction 24. Further, bold arrows conceptually indicate the order of the recognition of the identical cells, and show that the recognition of the identical cells is performed within the same level, i.e., for each of the levels.

Figure 7:
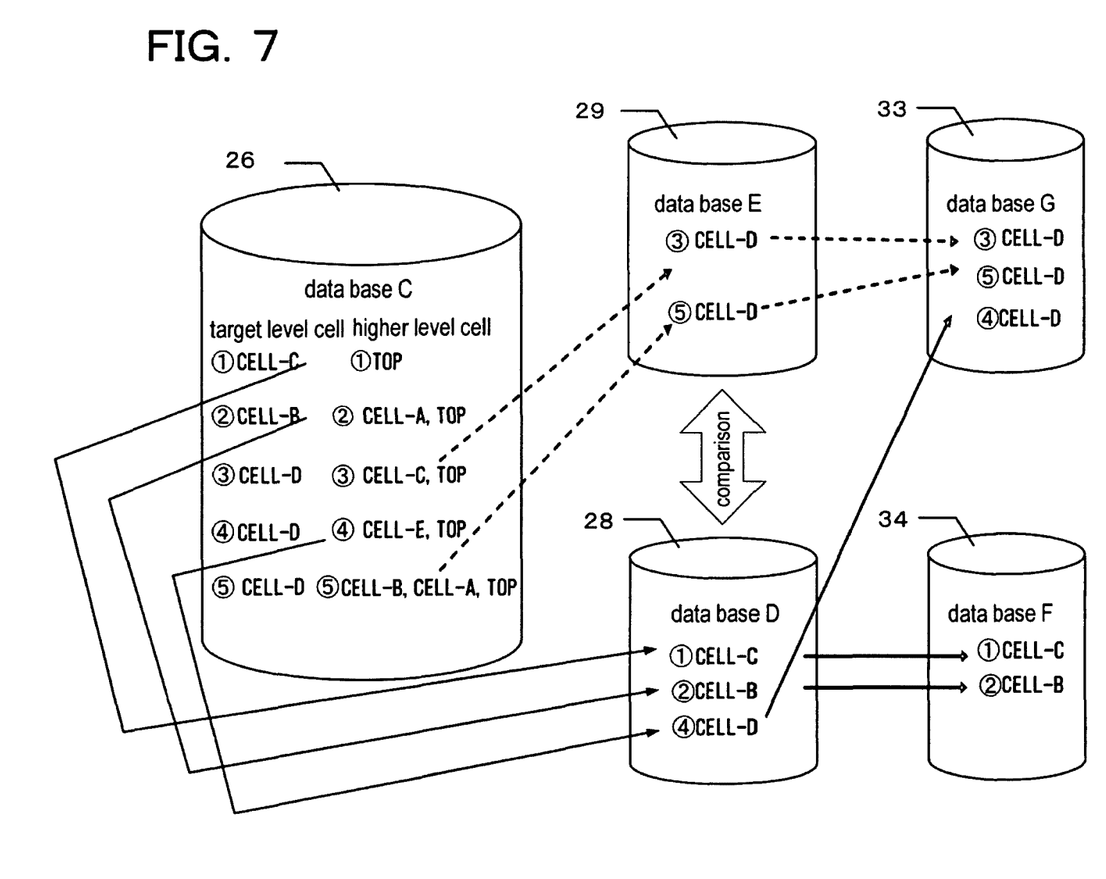
FIG. 7 illustrates a plurality of determination processes.

With reference to FIG. 7, description will be made of the processes of making the determinations 27, 30, and 32. As a result of these processes, the cells are classified, and the cells used to correct the pattern data are identified.

The process of making the determination 27 is a process of making the following determinations by using the registration data 60 and the data representing the hierarchical structure formed by the parent cell and the child cells. Firstly, with the use of "the cell names of all higher level cells relating to the child cell" included in the data representing the hierarchical structure formed by the parent cell and the child cells, determination is made on whether or not a child cell of the target level is identical to one of the child cells of a level higher than the target level. Further, with the use of "the cell name of the identical cells" included in the registration data 60, determination is made on whether or not a child cell of the target level is placed inside two or more child cells of a level immediately higher than the target level.

Then, if the child cell is determined to be positive in the determination 27, the child cell is registered in the database E29. Meanwhile, if the child cell is determined to be negative in the determination 27, the child cell is registered in the database D28.

The process of making the determination 30 is a process of determining whether or not the determination 27 has been made on all of the levels. If there is a level on which the determination 27 has not been made, the procedure returns to the process of making the determination 27. Meanwhile, if the determination 27 has been made on all of the levels, the cell classification 31 is completed.

In the process of making the determination 32, determination is made on whether or not a cell identical to the cells registered in the database E29 has been registered in the database D28. If the result of the determination 32 is positive, the identical cell is extracted from the database D28 and registered in the database G33. Further, the cells registered in the database E29 are also registered in the database G33. Then, the cells remaining in the database D28 are registered in the database F34. Meanwhile, if the result of the determination 32 is negative, the cells registered in the database D28 are registered in the database F34, and the cells registered in the database E29 are registered in the database G33. The cells registered in the database F34 are used to correct the pattern data.

According to the above-described processes up to the cell classification 31, the text data is used in place of the pattern data forming the cells to perform the identical cell extraction 24 and the identical cell registration 25 of the identical cells considered to be equivalent in the purpose of the OPC processing. Therefore, it is possible to classify, in a short time, the cells on which the OPC processing is actually performed and the identical cells to which the result of the OPC processing on the former cells can be directly applied. That is, the cells used to correct the pattern data can be effectively selected. This is because the number of the text data items is smaller than the number of the pattern data items.

The cells registered in the database F34 are classified with the use of the placement coordinates, the rotation information, the X-Y axis inversion information, the magnification information, and the vertex coordinates of an object included in the identical cells. If the cells are different in the rotation information and the X-Y axis inversion information but are identical in the other information, the cells are determined to be the identical cells. That is, in the determination of identity, if the cells are not completely identical but are similar to each other, the cells are determined to be the identical cells. Therefore, the range of the identical cells to which the result of the OPC processing can be directly applied is increased. Accordingly, the time actually taken for the OPC processing is reduced.

Figure 8:
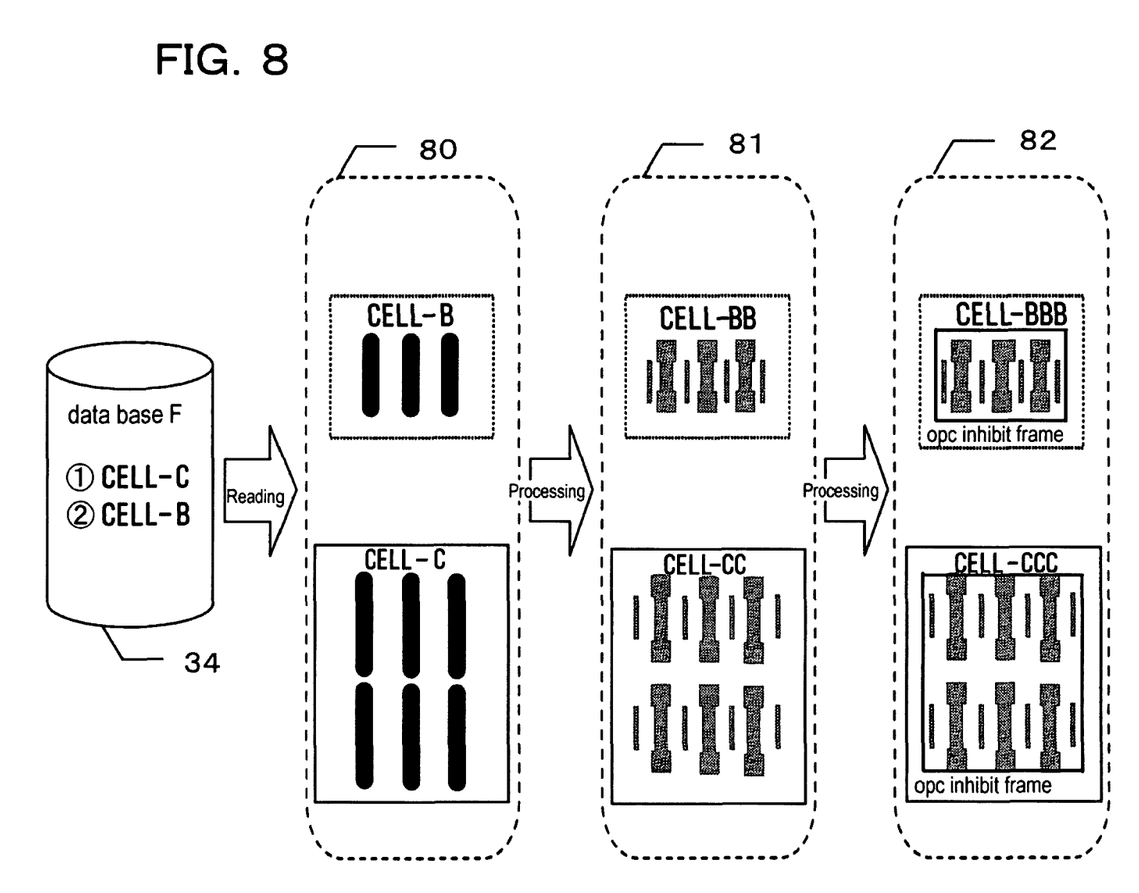
FIG. 8 illustrates a process of in-cell pattern data correction, a process of OPC inhibit frame formation, a process of cell replacement, and a process of making determination.

With reference to FIG. 8, description will be made of the process of the in-cell pattern data correction 35, the process of the OPC inhibit frame formation 37, the process of the cell replacement 39, and the process of making the determination 41. Therefore, FIG. 8 illustrates the database F34, an in-cell pattern 80, an in-cell pattern 81 subjected to the pattern data correction, and an in-cell pattern 82 subjected to the OPC inhibit frame formation 37.

The process of the in-cell pattern data correction 35 is a process of performing, with the use of the data of the condition file 11, the OPC processing on the pattern data inside the cells registered in the database F34.

Herein, the OPC processing will be described as follows in terms of the pattern of an actual photomask. That is, the OPC processing is a process of predicting, on the basis of the space and the width of the patterns inside a cell and optical conditions in the transfer, the deformation of the pattern of the photomask occurring in the transfer of the pattern to the semiconductor substrate, and deforming the initial patterns inside the cell so that the initial patterns inside the cell can be reproduced.

Thus, the OPC processing performed on the pattern data inside a cell is a process of deforming the pattern data inside the cell on the basis of the space and the width of the pattern data inside the cell and the optical conditions to prevent the deformation occurring in the transfer of the pattern data to the semiconductor substrate.

The optical conditions in the transfer relate to the exposure device used in the transfer process using the photomask, for example, and relate to the lens resolution such as the light wavelength and the lens numerical aperture.

Therefore, the process of the in-cell pattern data correction 35 handles the pattern data. With reference to an actual pattern according to the process, the process of the in-cell pattern data correction 35 will be specifically described below.

The in-cell pattern 80 registered in the database F34 is identified on the basis of the database F34, and includes the cells B and C. The cell B is formed by three rectangular patterns, and the cell C is formed by six rectangular patterns.

In this case, the pattern space and the pattern width of the patterns inside the cells B and C are identified. Then, the condition file 11 is read, and deformation patterns for reproducing the rectangular patterns are identified. Then, the initial rectangular patterns are replaced by the deformation patterns. Thereby, cells BB and CC illustrated in the in-cell pattern 81 are obtained. The deformation patterns include array patterns each having wider ends than the ends of the rectangular patterns, and rectangular assist patterns placed between the array patterns. The ends of the rectangular patterns are narrowed in the transfer process, and thus need to be previously expanded. Meanwhile, the longer sides of the rectangular patterns are expanded. Thus, the rectangular patterns need to be adjusted to an appropriate width by the insertion of the rectangular assist patterns, which increases the amount of diffracted light. The assist patterns are not resolvable with the resolution of this case. Thus, the assist patterns are not transferred.

Then, the cells BB and CC formed by the pattern data corresponding to the in-cell pattern 81 are registered in the database H36.

In the process of the OPC inhibit frame formation 37, the following processes are performed. Firstly, the OPC inhibit frame described in FIG. 2 is set in the cells BB and CC. The setting of the OPC inhibit frame will be described with reference to FIGS. 10A and 10B. Then, on the basis of the pattern data representing the OPC inhibit frame and the pattern data representing the pattern inside the OPC inhibit frame, cells BBB and CCC illustrated in the in-cell pattern 82 are formed. Then, the cells BBB and CCC are registered in the database I38.

In the process of the cell replacement 39, as described in FIG. 2, in the area inside the OPC inhibit frame, the pattern data corresponding to the cell B and the pattern data corresponding to the cell C are replaced by the pattern data corresponding to the cell BB and the pattern data corresponding to the cell CC, respectively, to thereby form the respective replacement cells. Then, the replacement cells are registered in the database J40.

Figure 9:
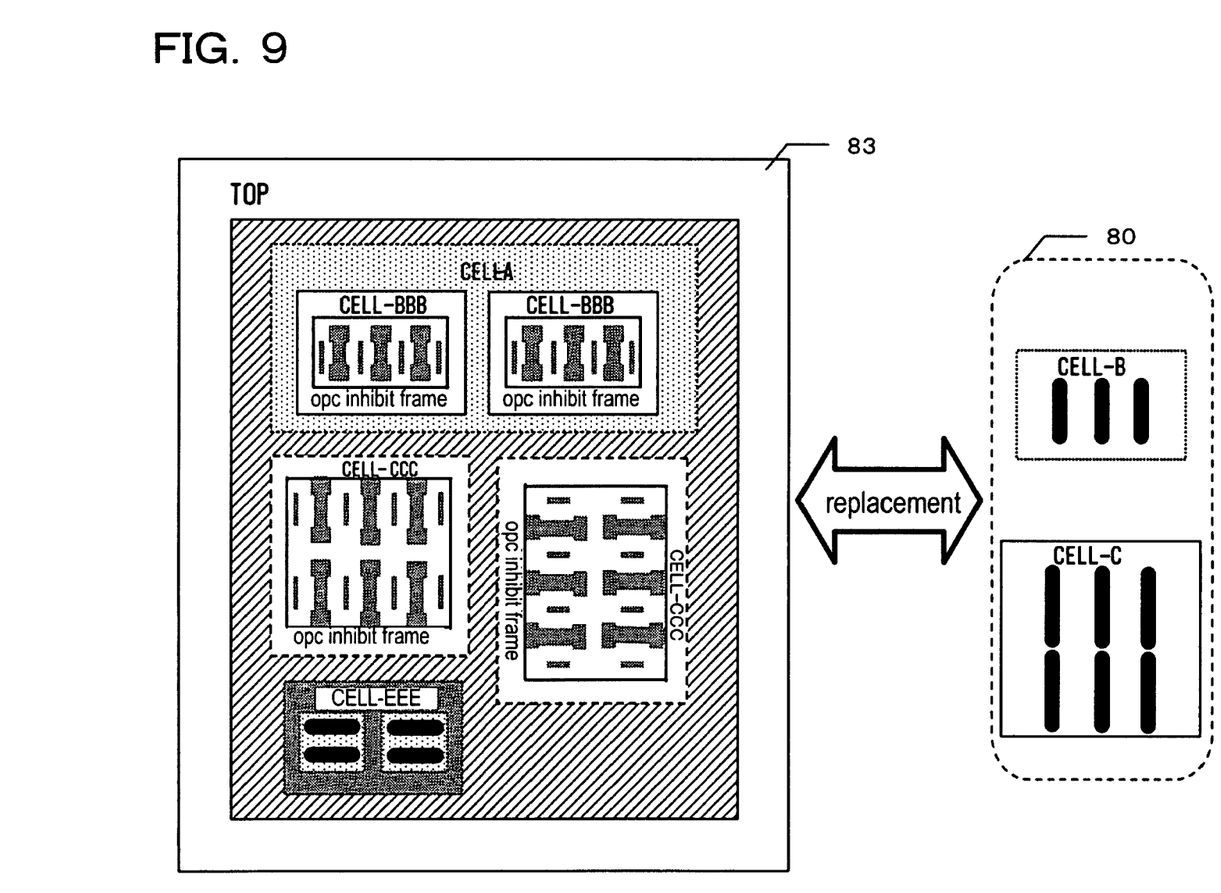
FIG. 9 illustrates the pattern of a top cell obtained after the process of the cell replacement and an in-cell pattern.

Then, the determination 41 is made on whether or not the above-described process has been performed on the cells excluding the top cell 51. As a result, if it is determined that the cell replacement 39 has been performed on the cells excluding the top cell 51, the procedure proceeds to the next process. With reference to FIG. 9, description will be made of the pattern of the top cell 51 obtained after the process of the cell replacement 39 performed on the cells excluding the top cell 51.

In the process of the pattern data correction 42, the following processes are performed. Firstly, the pattern data representing the pattern outside the OPC inhibit frame is associated with the top cell 51. Then, upon the input of the condition file 11, the pattern data included in the top cell 51 and located outside the OPC inhibit frame (the pattern data not yet subjected to the OPC processing) is subjected to the pattern data correction 42, i.e., the so-called OPC processing. As a result, the database K43 is formed.

FIG. 9 illustrates the pattern of a top cell 83 obtained after the process of the cell replacement 39 and the in-cell pattern 80. The in-cell pattern 80 is similar to the corresponding one described in FIG. 8.

The pattern data of the input data 10 forming the top cell 83 includes the data representing the in-cell pattern 80. Thus, after the cell replacement 39, the cells BBB and CCC subjected to the OPC processing are included in the top cell of the input data 10, as in the top cell 83.

Figure 10A:
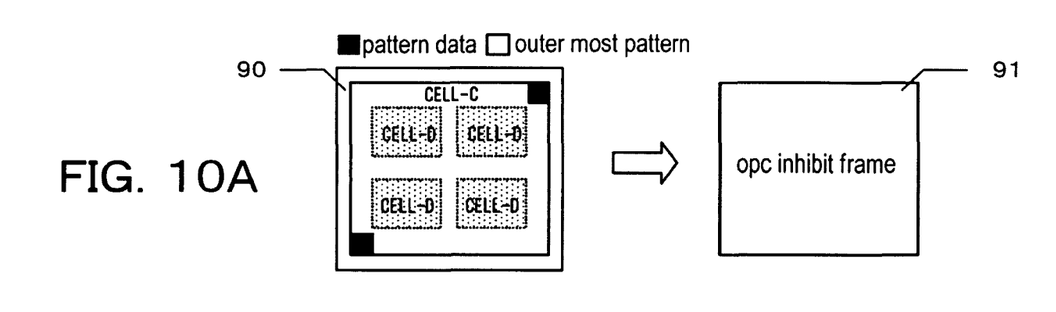
FIGS. 10A and 10B are diagrams for explaining the setting of an OPC inhibit frame with reference to an actual pattern.
Figure 10B:
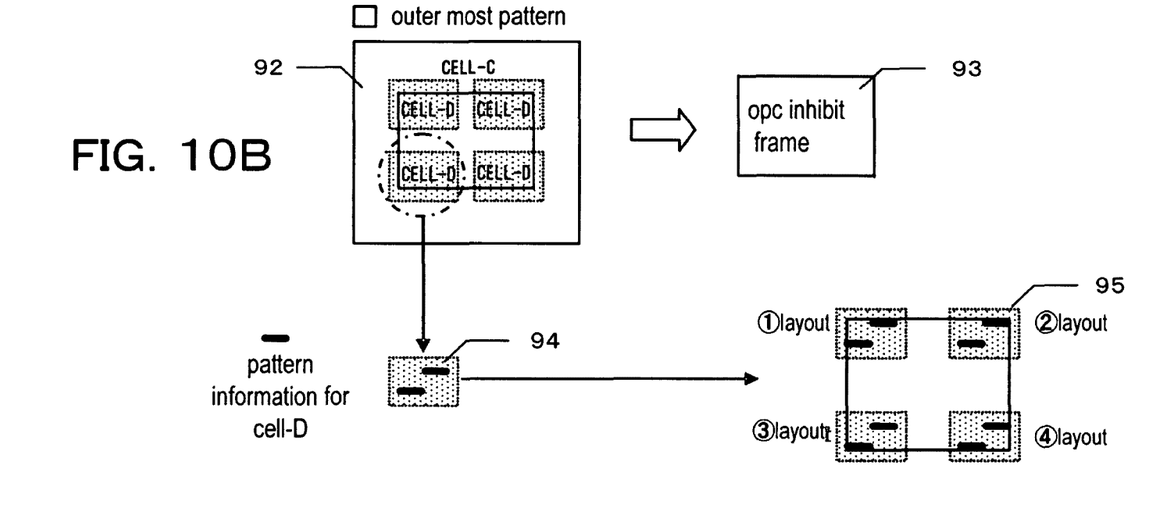

FIGS. 10A and 10B are diagrams for explaining the setting of the OPC inhibit frame with reference to an actual pattern. FIG. 10A illustrates an OPC inhibit frame 91 set on the outer circumference of the pattern forming the cell C, and a cell 90 set with the OPC inhibit frame 91. FIG. 10B illustrates an OPC inhibit frame 93 set on the outer circumference of the area occupied by the actual pattern corresponding to the pattern data always subjected to the same correction, a cell 92 set with the OPC inhibit frame 93, a cell D94, and an enlarged view 95.

In this case, the OPC inhibit frame described in FIG. 2 corresponds to the OPC inhibit frame 93. The OPC inhibit frame 93 can be formed by the following processes.

Firstly, if the cell C is repeated placed, the OPC inhibit frame 91 is set on the outermost circumference of the area defined by the respective repetition widths in the vertical and horizontal directions. Meanwhile, if the cell C is not repeated placed, the OPC inhibit frame 91 is set on the outer circumference of the outermost pattern.

Then, the OPC processing is performed on the target cell C in consideration of a pattern adjacent thereto. If the adjacent pattern is different, the shape of the deformation pattern obtained after the OPC processing is different in the periphery of the cell C. Therefore, in the cell CC obtained by the OPC processing performed on the cell C, an area including an identical deformation pattern is previously obtained by simulation. Then, if the outermost circumference of the area including the identical deformation pattern is the same as the OPC inhibit frame 91, the OPC inhibit frame 91 is directly set as the OPC inhibit frame 93. Meanwhile, if the area including the identical deformation pattern is smaller than the area enclosed by the OPC inhibit frame 91, the outermost circumference of the area including the identical deformation pattern is set as the OPC inhibit frame 93.

For example, four cells D94 are placed inside the cell C. Further, two rectangular patterns are placed inside each of the cells D94. In this case, the OPC inhibit frame 93 has a rectangular pattern enclosing all of the rectangular patterns forming the cells D94, for example, as illustrated in the enlarged view 95.

To summarize the above description, the first embodiment relates to a method of making pattern data of the pattern of a photomask from the input data 10 formed by a plurality of first cells forming a hierarchical structure. Further, the method of making pattern data includes the following processes. That is, the method includes a process of adding, to each of the first cells, information of the first cell higher than the first cell on the basis of the hierarchical structure. The method further includes first to fourth cell group formation processes. The first cell group formation process sequentially focuses on all levels of the hierarchical structure, selects, from the first cells included in the focused one of the levels, the first cell identical to one of the first cells included in a level higher than the focused level and the first cell placed inside two or more of the first cells included in a level immediately higher than the focused level, and adds the selected first cells to a first cell group (the database E29). The second cell group formation process sequentially adds, on all levels of the hierarchical structure, the first cells not selected in the first cell group formation process to a second cell group (the database D28). The third cell group formation process excludes, from the first cells included in the second cell group, the first cell identical to the first cells included in the first cell group to form a third cell group (the database F34). The fourth cell group formation process converts pattern data forming the first cells included in the third cell group to make converted pattern data in which the optical proximity effect has been corrected, and forms a fourth cell group (the database H36) with second cells including the converted pattern data. The method further includes a process of replacing the first cells with the corresponding second cells in the input data 10.

A characteristic of the method lies in that, in the determination of identity in the first cell group formation process, if the first cells are similar to each other, the cells are determined to be identical. Another characteristic of the method lies in that the method further includes a process of converting the input data 10 into text data, and that the text data is used in the execution of the respective processes.

Therefore, the text data is used in place of the pattern data forming the cells to perform the identical cell extraction 24 and the identical cell registration 25 of the identical cells considered to be equivalent in the purpose of the OPC processing. Therefore, it is possible to classify, in a short time, the cells on which the OPC processing is actually performed and the identical cells to which the result of the OPC processing on the former cells can be directly applied. That is, the cells used to correct the pattern data can be effectively selected. This is because the number of the text data items is smaller than the number of the pattern data items.

The cells registered in the database F34 are classified with the use of the placement coordinates, the rotation information, the X-Y axis inversion information, the magnification information, and the vertex coordinates of an object included in the identical cells. If the cells are different in the rotation information and the X-Y axis inversion information but are identical in the other information, the cells are determined to be the identical cells. That is, in the determination of identity, if the cells are not completely identical but are similar to each other, the cells are determined to be the identical cells. Therefore, the range of the identical cells to which the result of the OPC processing can be directly applied is increased. Accordingly, the time actually taken for the OPC processing is reduced.

As a result, the time for making the drawing data to form the photomask is reduced.

Second Embodiment

Figure 11:
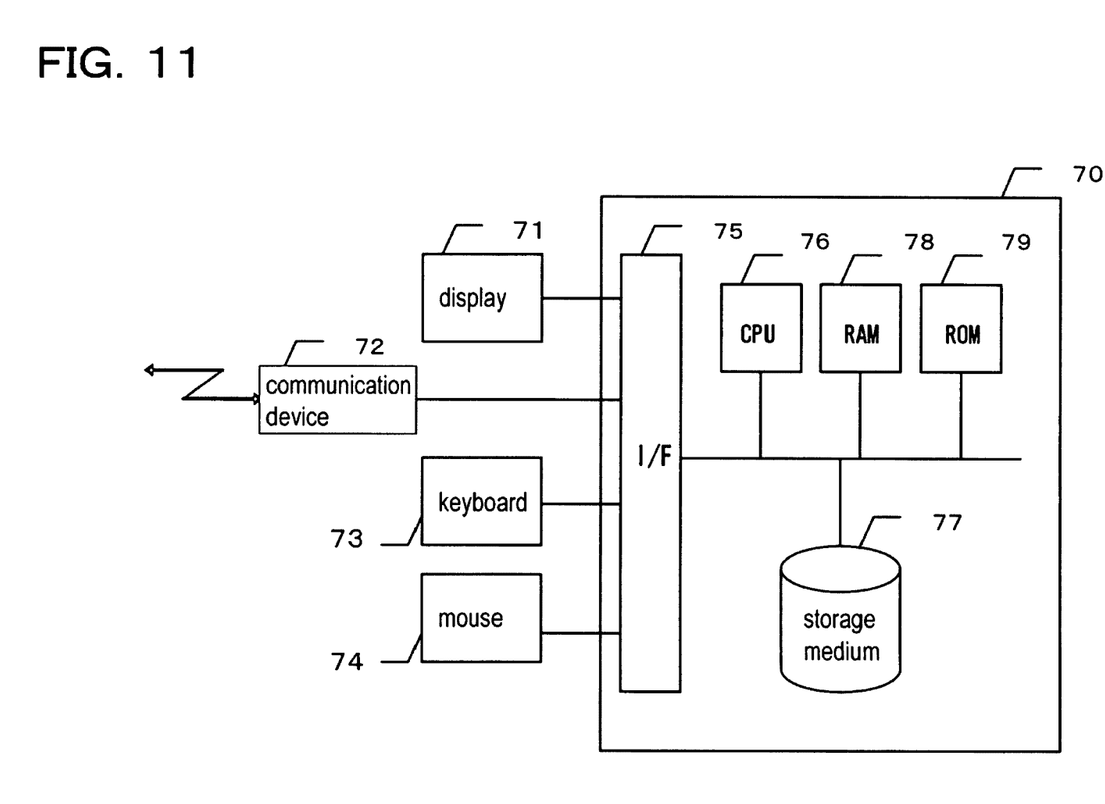
FIG. 11 illustrates a pattern data processing system.

With reference to FIG. 11, a pattern data processing system 70 will be described. The pattern data processing system 70 is formed by an I/F (interface) 75, a CPU (Central Processing Unit) 76, a storage medium 77, a RAM (Random Access Memory) 78, and a ROM (Read-Only Memory) 79. Further, the pattern data processing system 70 receives inputs of data from input devices such as a display 71, a communication device 72, a keyboard 73, and a mouse 74.

The display 71 is a device used to display, for example, the processing state of the input data 10 and the pattern data and the result of processing. The keyboard 73 and the mouse 74 are input devices used in a manual input operation. The communication device 72 is a device for receiving externally input large-volume data such as the input data 10 and transmitting the result of processing in accordance with an electromagnetic method.

The I/F (interface) 75 is a device for receiving the data input from the input devices such as the keyboard 73 and the mouse 74 and converting the data into a data format processable by the pattern data processing system 70. The ROM 79 is a device for storing, for example, a control program and initialization data used by the pattern data processing system 70. The RAM 78 is a device for, for example, temporarily storing the input data and storing the result of the processing performed by the CPU 76. The CPU 76 is a device for, for example, performing the OPC processing on the input data 10 in accordance with the above-described control program and controlling the input and output of the data with respect to the storage medium 77 and the RAM 78 which stores the result of processing. The storage medium 77 is a device for storing large-volume data. The above-described control program is a program for performing the pattern data creation method described with reference to the flowcharts illustrated in FIGS. 2 and 3.

With the above configuration, to perform the processes up to the cell classification 31 in accordance with the control program, the pattern data processing system 70 uses the text data to perform the identical cell extraction 24 and the identical cell registration 25 of the identical cells considered to be equivalent in the purpose of the OPC processing. Therefore, it is possible to classify, in a short time, the cells on which the OPC processing is actually performed and the identical cells to which the result of the OPC processing on the former cells can be directly applied. That is, the cells used to correct the pattern data can be effectively selected.

Further, the cells registered in the database F34 are classified with the use of the placement coordinates, the rotation information, the X-Y axis inversion information, the magnification information, and the vertex coordinates of an object included in the identical cells. If the cells are different in the rotation information and the X-Y axis inversion information but are identical in the other information, the cells are determined to be the identical cells. Therefore, the range of the identical cells to which the result of the OPC processing can be directly applied is increased. Accordingly, the pattern data processing system 70 can reduce the time actually taken for the OPC processing.

The present invention can provide a method of making photomask pattern data for effectively selecting particular areas or cells to be subjected to the OPC processing and exhaustively and effectively identifying, among the areas or cells, areas or cells considered to be equivalent in the purpose of the OPC processing, a program for making the pattern data, and a medium for storing the program.

All examples and conditional language recited herein are intended for pedagogical purposes to aid the reader in understanding the invention and the concept contributed by the inventor to furthering the art, and are to be construed as being without limitation to such specifically recited examples and conditions, nor does the organization of such examples in the specification related to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of making pattern data of a pattern of a photomask from input data formed by a plurality of first cells forming a hierarchical structure, the method comprising:
   converting the input data into text data;
   adding, to each of the first cells, information of parent cells of the each of the first cells, the parent cells being in a higher level of the hierarchical structure than a level of the each of the first cells;
   forming a first cell group from the first cell identical to one of the first cells included in same level of the hierarchical structure and the first cell placed inside one of parent cells included in a level immediately higher than a level including the first cell;
   forming a second cell group from the first cells, in each level of hierarchical structure, not included in the first cell group;
   forming a third cell group by excluding, from the second cell group, a first cell in the second cell group identical to an another first cell included in the first cell group;
   forming a fourth cell group formed by converting pattern data representing the cells included in the third cell group to make converted pattern data representing second cells; and
   replacing the first cells with the corresponding second cells in the input data to create corrected data that is used for forming the pattern of the photomask,
   wherein the converted pattern data is formed by correcting the pattern data in accordance with an optical proximity effect for the patterns of the photomask ultimately formed in accordance with the corrected data, and
   each of the adding, forming the first cell group, forming the second cell group, forming the third cell group and forming the fourth cell group are executed based on a comparison of the text data.

2. The method of making pattern data according to claim 1, wherein, in the determination of identity between the first cell and one of the parent cells in the forming the first cell group, if the first cell is similar to the one of parent cells, the first cell is determined to be identical to the one of the parent cells.

3. The method of making pattern data according to claim 1, further comprising:
   forming a fifth cell group from the first cells included in the first cell group, and the first cell that is included in the second cell group and is identical to one of the first cells included in the first cell group.

4. The method of making pattern data according to claim 1, wherein, if the first cells further include one of data of placement coordinates, data of rotation information, and data of axis inversion information, in the determination of identity between the first cell and one of the parent cells in the forming the first cell group, the one of the data of placement coordinates, the data of rotation information, and the data of axis inversion information is not used.

5. The method according to claim 1, wherein the corrected data is stored in a non-transitory storage medium.

6. A non-transitory medium for storing a program for causing a pattern data processing system to perform a method of making pattern data for a pattern of a photomask upon receipt of input data formed by a plurality of first cells forming a hierarchical structure,
   the method comprising:
   converting the input data into text data;
   adding, to each of the first cells, information of parent cells of the each of the first cells, the parent cells being in a higher level than a level of the each of the first cells;
   forming a first cell group from the first cell identical to one of the first cells included in same level of the hierarchical structure and the first cell placed inside two or more of the parent cells included in a level immediately higher than the level including the first cell;
   forming a second cell group from the first cells not included in the first cell group;
   forming a third cell group by excluding a first cell in the first cell group identical to an another first cell included in the first cell group;
   forming a fourth cell group formed by converting pattern data representing the cells included in the third cell group to make converted pattern data representing second cells; and
   replacing the first cells with the corresponding second cells in the input data to create corrected data,
   wherein the converted pattern data is formed by correcting the pattern data in accordance with an optical proximity effect for the patterns of the photomask ultimately formed in accordance with the corrected data, wherein each of the adding, forming the first cell group, forming the second cell group, forming the third cell group and forming the fourth cell group are executed based on a comparison of the text data.

7. The non-transitory medium for storing a program for causing a pattern data processing system to perform the method of making pattern data according to claim 6, wherein, in the determination of identity between the first cell and one of the parent cells in the forming the first cell group, if the first cell is similar to the one of the parent cells, the first cell is determined to be identical to the one of the parent cells.

8. The non-transitory medium for storing a program for causing a pattern data processing system to perform the method of making pattern data according to claim 6, wherein, if the first cells further include one of data of placement coordinates, data of rotation information, and data of axis inversion information, in the determination of identity between the first cell and the one of the parent cells in the forming the first cell group, the one of the data of placement coordinates, the data of rotation information, and the data of axis inversion information is not used.

9. A pattern data processing system for executing the program according to claim 6, the pattern data processing system comprising:

an interface for receiving the input data and performing data conversion on the input data;

a central processing unit for receiving the input data and executing the program;

a read-only memory for storing the program used by the central processing unit; and a storage medium for storing the result of processing received from the central processing unit.

\* \* \* \* \*